(12) United States Patent
Nakashima

(10) Patent No.: US 8,585,030 B2
(45) Date of Patent: Nov. 19, 2013

(54) SUBSTRATE PROCESSING APPARATUS

(75) Inventor: Mikio Nakashima, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 823 days.

(21) Appl. No.: 12/562,818

(22) Filed: Sep. 18, 2009

(65) Prior Publication Data
US 2010/0078867 A1 Apr. 1, 2010

(30) Foreign Application Priority Data

Sep. 29, 2008 (JP) .................................. 2008-250343

(51) Int. Cl.
*B65D 85/57* (2006.01)
*B65D 85/62* (2006.01)

(52) U.S. Cl.
USPC ............ 269/303; 206/454; 206/711; 118/320

(58) Field of Classification Search
USPC ........... 269/303; 118/320, 500; 206/454, 711, 206/725; 134/137
See application file for complete search history.

(56) References Cited

U.S. PATENT DOCUMENTS

| | | | | |
|---|---|---|---|---|
| 3,486,631 A | * | 12/1969 | Rodman .................... 211/41.18 |
| 3,961,877 A | * | 6/1976 | Johnson ....................... 432/253 |
| 4,160,504 A | * | 7/1979 | Kudlich et al. ............... 206/711 |
| 4,256,229 A | * | 3/1981 | Lee ............................ 211/41.18 |
| 4,471,716 A | * | 9/1984 | Milliren ........................ 118/500 |
| 4,669,612 A | * | 6/1987 | Mortensen .................... 206/454 |
| 4,676,008 A | * | 6/1987 | Armstrong ....................... 34/237 |
| 4,740,249 A | * | 4/1988 | McConnell ................... 134/25.4 |
| 4,872,554 A | * | 10/1989 | Quernemoen ................. 206/454 |
| 4,880,116 A | * | 11/1989 | Kos ............................... 206/454 |
| 5,011,041 A | * | 4/1991 | Kakizaki ....................... 220/507 |
| 5,020,476 A | * | 6/1991 | Bay et al. ...................... 118/728 |
| 5,207,324 A | * | 5/1993 | Kos ............................... 206/711 |
| D345,834 S | * | 4/1994 | Craft et al. ..................... D32/55 |

(Continued)

FOREIGN PATENT DOCUMENTS

| | | |
|---|---|---|
| JP | 07-308642 A | 11/1995 |
| JP | 10-284459 A | 10/1998 |
| JP | 11-233584 A | 8/1999 |

OTHER PUBLICATIONS

An Office Action dated Nov. 16, 2011, issued from the Japanese Patent Office (JPO) of Japanese Patent Application No. 2008-250343 and a partial English translation thereof.

*Primary Examiner* — Phi A
(74) *Attorney, Agent, or Firm* — Abelman, Frayne & Schwab

(57) ABSTRACT

Disclosed is a substrate processing apparatus which can inhibit the occurrence of spots, such as watermarks, by reducing the remaining of the liquid that has been used for liquid treatment, inhibit the turn-over of the wafer, and improve throughput. In the disclosed substrate processing apparatus including a carrying means for carrying a semiconductor wafer W while vertically holding the wafer, a wafer boat (a carrying means) includes lower holders holding the bottom portion of the wafer, and a couple of left/right upper holders for holding the bottom outer edges of the wafer when the wafer is turned over. The lower holder includes a holding groove part and a turn-over prevention groove part, which are integrally formed with each other. The holding groove part includes holding grooves directly holding the bottom portion of the wafer, and the turn-over prevention groove part is disposed adjacent to the holding groove part and includes turn-over prevention grooves for holding the wafer when the holding of the wafer by the holding grooves has been released.

7 Claims, 14 Drawing Sheets

(56) References Cited

U.S. PATENT DOCUMENTS

| | | | |
|---|---|---|---|
| 5,348,151 A * | 9/1994 | Dressen | 206/711 |
| 5,370,142 A * | 12/1994 | Nishi et al. | 134/61 |
| 5,445,263 A * | 8/1995 | Mohlenkamp et al. | 206/303 |
| D368,802 S * | 4/1996 | Gallagher et al. | D3/315 |
| 5,503,171 A * | 4/1996 | Yokomizo et al. | 134/182 |
| 5,575,394 A * | 11/1996 | Nyseth | 206/710 |
| 5,586,658 A * | 12/1996 | Nyseth | 206/711 |
| 5,704,493 A * | 1/1998 | Fujikawa et al. | 211/41.16 |
| 5,704,494 A * | 1/1998 | Nishikiori et al. | 211/41.12 |
| 5,730,162 A * | 3/1998 | Shindo et al. | 134/66 |
| 5,782,517 A * | 7/1998 | Mckee, IV | 294/27.1 |
| 5,791,357 A * | 8/1998 | Hasegawa | 134/137 |
| 5,817,185 A * | 10/1998 | Shindo et al. | 134/25.4 |
| 5,845,663 A * | 12/1998 | Han | 134/155 |
| 5,921,397 A * | 7/1999 | Whalen | 206/711 |
| 6,068,137 A * | 5/2000 | Takashima | 211/41.18 |
| 6,089,377 A * | 7/2000 | Shimizu | 206/711 |
| 6,092,981 A * | 7/2000 | Pfeiffer et al. | 414/810 |
| 6,176,377 B1 * | 1/2001 | Ali et al. | 211/41.1 |
| 6,318,389 B1 * | 11/2001 | Schmidt et al. | 134/201 |
| 6,340,090 B1 * | 1/2002 | Jahani et al. | 211/41.1 |
| 6,669,253 B2 * | 12/2003 | Benzing et al. | 294/15 |
| 6,691,876 B2 * | 2/2004 | Tsai et al. | 211/41.18 |
| 6,814,808 B1 * | 11/2004 | Gados et al. | 118/500 |
| 7,175,026 B2 * | 2/2007 | Hachtmann | 206/711 |

* cited by examiner

SUBSTRATE PROCESSING APPARATUS

This application is based on and claims priority from Japanese Patent Application No. 2008-250343, filed on Sep. 29, 2008 with the Japanese Patent Office, the disclosure of which is incorporated herein in its entirety by reference.

TECHNICAL FIELD

The present disclosure relates to a substrate processing apparatus including a carrying means for carrying a substrate, such as a semiconductor wafer or a flat panel display (FPD), while vertically holding the substrate with a plurality of holders.

BACKGROUND

In general, a fabrication method for a semiconductor device is carried out by a series of processing steps, in which a photoresist is applied to a semiconductor wafer or an FPD as a substrate (hereinafter, referred to as a wafer), a circuit pattern is size-reduced and transferred to the photoresist by photolithography techniques, the photoresist is developed, and then the photoresist is removed from the wafer.

In the processing steps, it is known that a substrate processing apparatus immerses the wafer of a vertical state in processing liquid, e.g., a processing tank containing chemical liquid by employing a carrying means for vertically holding a wafer with a plurality of holders, and discharging rinse liquid toward the surface of the wafer.

In such a conventional substrate processing apparatus, the carrying means includes a lower holder for holding the bottom portion of the substrate, and a couple of left/right upper holders for holding the bottom outer edges of the substrate when the substrate is turned over. The lower holder includes a V-shaped groove for directly holding the bottom portion of the wafer, and the upper holder includes a roughly Y-shaped turn-over prevention groove for preventing the turn-over of the wafer. For example, refer to Japanese Laid-Open Patent publication No. 10-284459 (FIGS. 4, 8, 9, and 10).

According to the substrate processing apparatus disclosed in Japanese Laid-Open Patent publication No. 10-284459, as configured above, the wafer vertically held by the carrying means is immersed in processing liquid, e.g., a processing tank containing chemical liquid, and the surface treatment of the wafer is carried out by discharging rinse liquid toward the surface of the wafer within the processing tank. Then, the wafer vertically held by the carrying means is pulled up from the processing tank and is carried into a drying chamber. Then, drying gas, e.g., nitrogen (N2) gas, is supplied into the drying chamber to perform a drying process.

SUMMARY

In one embodiment, a substrate processing apparatus includes a carrying means to carry a substrate while vertically holding the substrate with a plurality of holders. At least one holder of the plurality of holders includes a holding groove part having a holding groove directly holding the bottom portion of the substrate, and a turn-over prevention groove part disposed adjacent to the holding groove part, the turn-over prevention groove part including a turn-over prevention groove to hold the substrate when holding of the substrate by the holding groove is released. The holding groove part and the turn-over prevention groove part are integrally formed with each other.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
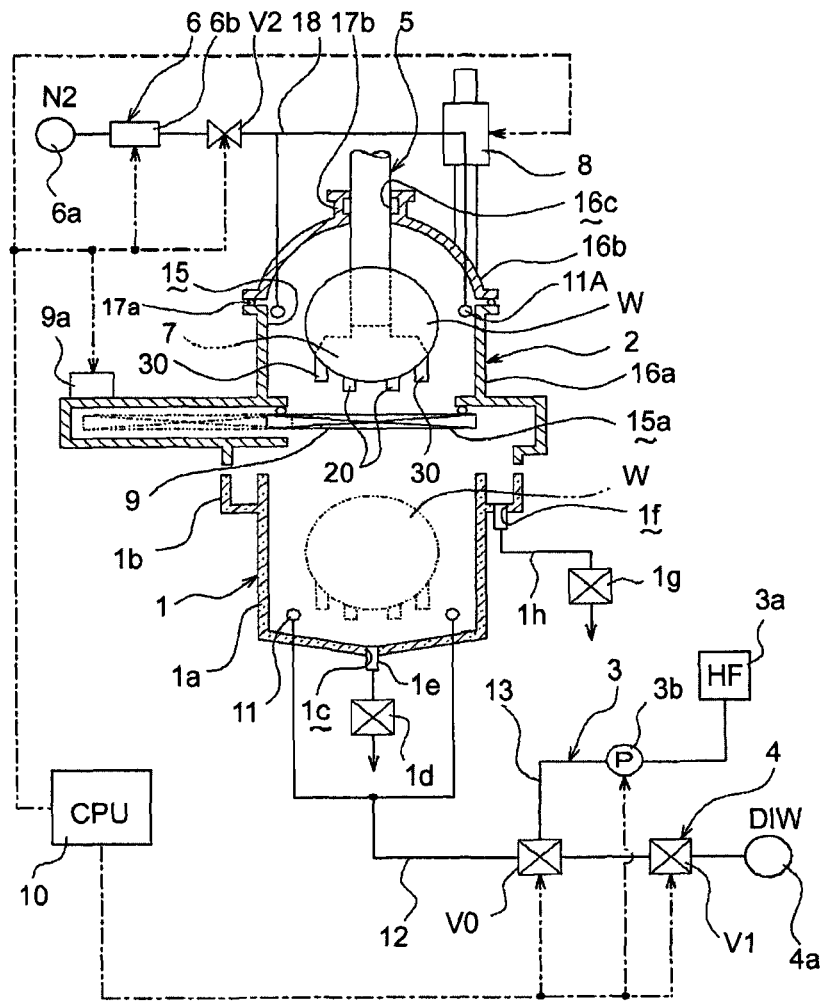
FIG. 1 is a cross-sectional view schematically illustrating an example of a washing/drying apparatus employing a substrate processing apparatus.

In the following detailed description, reference is made to the accompanying drawing, which form a part hereof The illustrative embodiments described in the detailed description, drawing, and claims are not meant to be limiting. Other embodiments may be utilized, and other changes may be made, without departing from the spirit or scope of the subject matter presented here.

In the substrate processing apparatus disclosed in Japanese Laid-Open Patent publication No. 10-284459, holding grooves (V-shaped grooves) provided in a lower holder requires a certain amount of depth because they directly hold a wafer. However, when the depth of the holding grooves is deep, processing liquid used in the treatment process, for example, chemical liquid, may be remained in the holding grooves, and a drying process following the liquid treatment requires a predetermined time, thereby reducing throughput. Moreover, there has been concern about the occurrence of spots, such as watermarks, after the drying process.

The present disclosure provides a substrate processing apparatus which can inhibit the occurrence of spots, such as watermarks, by reducing the remaining of processing liquid that has been used for liquid treatment, can inhibit the turn-over of a wafer, and can improve throughput.

In one embodiment, a substrate processing apparatus includes a carrying means to carry a substrate while vertically holding the substrate with a plurality of holders. At least one holder of the plurality of holders includes a holding groove part including a holding groove directly holding the bottom portion of the substrate, and a turn-over prevention groove part disposed adjacent to the holding groove part, the turn-over prevention groove part including a turn-over prevention groove to hold the substrate when holding of the substrate by the holding groove is released. The holding groove part and the turn-over prevention groove part are integrally formed with each other.

The substrate processing apparatus may further include a processing tank to contain processing liquid. The substrate may be immersed in the processing liquid within the processing tank while the substrate is held by the holders of the carrying means.

The carrying means may include a lower holder to hold the bottom portion of the substrate, and a couple of left/right upper holders to hold the bottom outer edges of the substrate when the substrate is turned over. The carrying means may include a couple of left/right upper holders to hold the bottom outer edges of the substrate, and a lower holder to hold the bottom portion of the substrate when the substrate is turned over.

In the embodiment described above, the contact area between the substrate and the holding grooves can be decreased. Also, the turn-over of the substrate can be inhibited by the turn-over prevention grooves when the holding of the substrate by the holding grooves is released, in other words, when the substrate rises from the holding grooves.

The lower holder for holding the bottom portion of the substrate, or the upper holders for holding the bottom outer edges of the substrate, may include multiple holding grooves and multiple turn-over prevention grooves, the multiple holding grooves and multiple turn-over prevention grooves being provided in parallel to each other to hold multiple substrates in parallel to each other. Accordingly, it is possible to simultaneously carry out liquid treatment of a plurality of wafers while stabilizing them.

The turn-over prevention groove may have an open end which is higher than an open end of the holding groove, and a groove bottom which is deeper than a groove bottom of the holding groove. The holding groove may be formed in a roughly V-shape, and the turn-over prevention groove may be formed in a roughly V-shape (or Y-shape) having a smaller opening angle than an opening angle of the holding groove. Accordingly, the turn-over prevention grooves can be formed in accordance with the width of the opening of the holding grooves.

The holding groove and the holding groove part may be formed downward with a slant toward the turn-over prevention groove and the turn-over prevention groove part. Accordingly, the processing liquid remaining in the holding grooves and the processing liquid attached to the holding grooves may be drained toward the turn-over prevention grooves.

At least a surface of the holding groove part having the holding groove may be made of a hydrophilic member, and at least a surface of the turn-over prevention groove part having the turn-over prevention groove may be made of a hydrophobic member. Accordingly, the holding groove part in contact with the substrate can prevent processing liquid from remaining on the substrate by adsorbing the processing liquid, and the turn-over prevention groove part not in contact with the substrate can inhibit the remaining of processing liquid that has been used for the processing, by resisting the processing liquid.

According to the present disclosure, the following advantages are achieved.

The contact area between a substrate and holding grooves can get smaller, and also when the substrate rises from the holding grooves, the turn-over of the substrate can be prevented by the turn-over prevention grooves. Accordingly, it is possible to inhibit the occurrence of spots, such as watermarks, by reducing the remaining of the liquid that has been used for liquid treatment, to inhibit the turn-over of the wafer, and to improve throughput.

It is possible to simultaneously carry out liquid treatment of multiple substrates while stabilizing them.

Since the turn-over prevention grooves may be formed in accordance with the width of the opening of the holding grooves, the holding grooves and the turn-over prevention grooves may be arranged with the same pitch, and multiple holding grooves and multiple turn-over prevention grooves may be formed in a small space.

Since the processing liquid remaining in the holding grooves and the processing liquid attached to the holding groove part can be drained toward the turn-over prevention grooves, the remaining of processing liquid that has been used for liquid treatment can be significantly reduced, thereby more effectively inhibiting the occurrence of spots, such as watermarks.

The holding groove part in contact with the substrate can prevent processing liquid from remaining on the substrate by adsorbing the processing liquid, and the turn-over prevention groove part not in contact with the substrate can inhibit the remaining of processing liquid that has been used for the processing, by resisting the processing liquid. Accordingly, the remaining of processing liquid that has been used for liquid treatment can be significantly reduced, thereby more effectively inhibiting the occurrence of spots, such as watermarks.

Hereinafter, embodiments of the present disclosure will be described in detail with reference to the accompanying drawings. In some embodiments, the substrate processing apparatus according to the present disclosure is applied to a washing/drying apparatus for a semiconductor wafer.

First Embodiment

As shown in FIG. 1, a washing/drying apparatus includes a processing tank 1 for housing a semiconductor wafer W, which is a substrate to be processed (hereinafter, referred to as a wafer W); a drying chamber 2 for housing wafer W, which is positioned above processing tank 1; a chemical-liquid supply means 3 for supplying chemical liquid for removing an oxide film, for example, diluted hydrofluoric acid (DHF), as processing liquid, to wafer W within processing tank 1; a rinse-liquid supply means 4 for supplying washing rinse liquid, as additional processing liquid, to wafer W within processing tank 1; a drying gas supply means 6 for supplying drying gas, such as nitrogen gas (N2 gas) or clean air, into drying chamber 2; and a control means, for example, a central processing unit 10 (hereinafter, referred to as a CPU 10), for transferring a control (operation) signal to chemical-liquid supply means 3, rinse-liquid supply means 4, and drying gas supply means 6, and a wafer boat 5 (a carrying means in the present disclosure), a vessel cover lifting device 8, and a shutter 9, which will be described later.

Processing tank 1 includes an inner tank 1a for housing wafer W, and an outer tank 1b surrounding the outer circumferential portion of the upper opening of inner tank 1a. In the bottom portion of inner tank 1a, a drain hole 1c is provided, and drain hole 1c is connected to a drain tube 1e provided with a drain valve 1d. A drainage 1f is provided at the bottom portion of outer tank 1b, and drainage 1f is connected to a drain pipe 1h provided with an opening/closing valve 1g.

A supply nozzle 11 is disposed at the lower side within inner tank 1a of processing tank 1. Supply nozzle 11 is connected to a DIW (deionized water, that is, rinse liquid) supply source 4a via a main supply tube 12. A first opening/closing valve V1 is provided in the direction toward DIW supply source 4a of the main supply tube 12. DIW supply source 4a, main supply tube 12, first opening/closing valve V1, and supply nozzle 11 constitute rinse-liquid supply means 4.

An opening/closing switch valve V0 is provided at the halfway point of main supply tube 12, and a chemical-liquid (e.g., hydrogen fluoride, HF) supply tank 3a is connected to opening/closing switch valve V0 via a chemical-liquid supply tube 13. Also, a pump 3b is provided in chemical-liquid supply tube 13. Supply tank 3a, chemical-liquid supply tube 13, pump 3b, opening/closing switch valve V0, main supply tube 12, and supply nozzle 11 constitute chemical-liquid supply means 3. Herein, DIW flowing within main supply tube 12 is mixed with HF supplied from supply tank 3a, thereby supplying chemical liquid (DHF) with a predetermined concentration from supply nozzle 11 into processing tank 1.

Meanwhile, drying chamber 2 mainly includes a vessel body 16a with a size capable of housing multiple (for example, 50) wafers W, which has a loading/unloading hole 15 at an upper portion, and a vessel cover 16b for opening or closing loading/unloading hole 15 formed at the upper portion of vessel body 16a. Herein, vessel cover 16b has an upside-down U-shaped cross section and can be moved up and down by lifting device 8. Lifting device 8 is electrically connected to CPU 10, and is operated by a control (operation) signal from CPU 10, thereby opening or closing vessel cover 16b. When vessel cover 16b is moved up, loading/unloading hole 15 is opened and is placed in a state capable of loading wafer W to vessel body 16a. After wafer W is loaded and housed in vessel body 16a, vessel cover 16b is moved down, blocking up loading/unloading hole 15. In this case, the gap between vessel body 16a and vessel cover 16b is sealed by a lip-type O-ring 17a.

Figure 2:
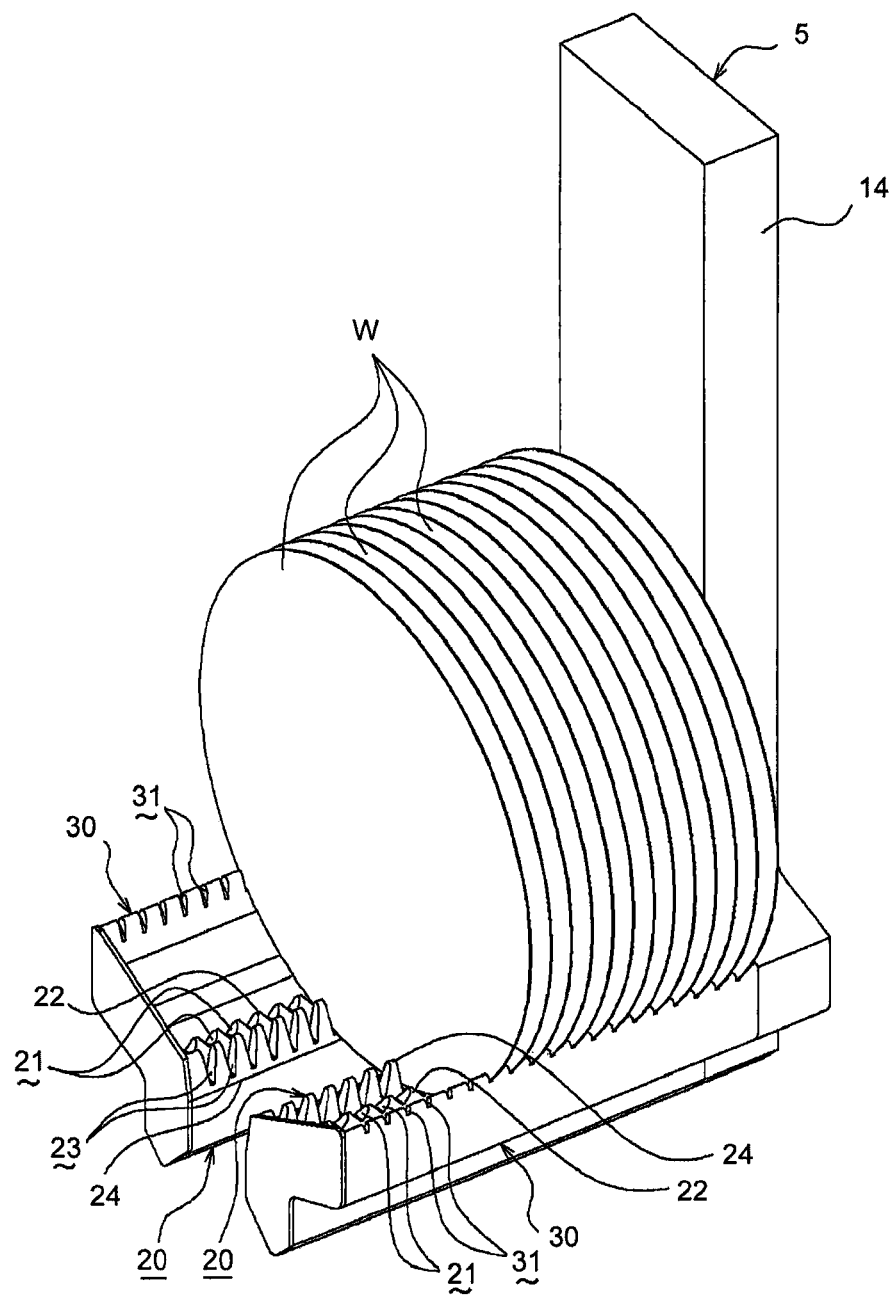
FIG. 2 is a perspective view illustrating a wafer boat according to a first embodiment.
Figure 3:
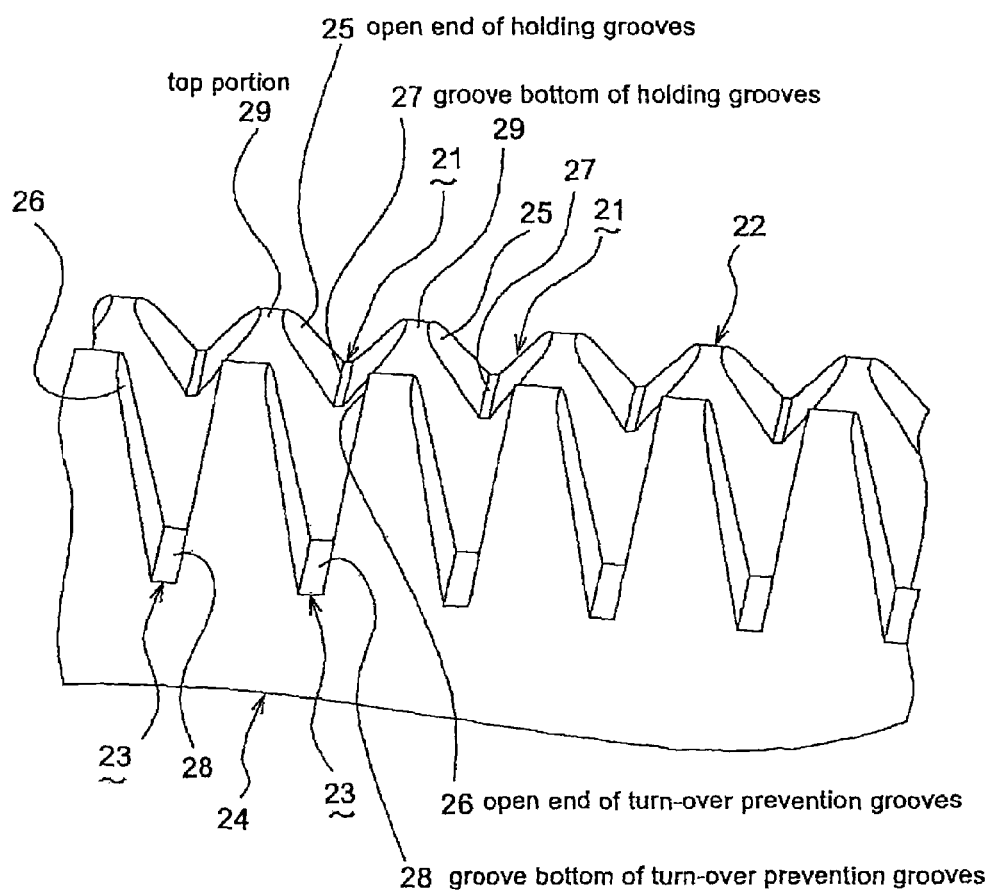
FIG. 3 is an enlarged perspective view of a main part including holding grooves and turn-over prevention grooves of a lower holder according to the first embodiment.
Figure 4:
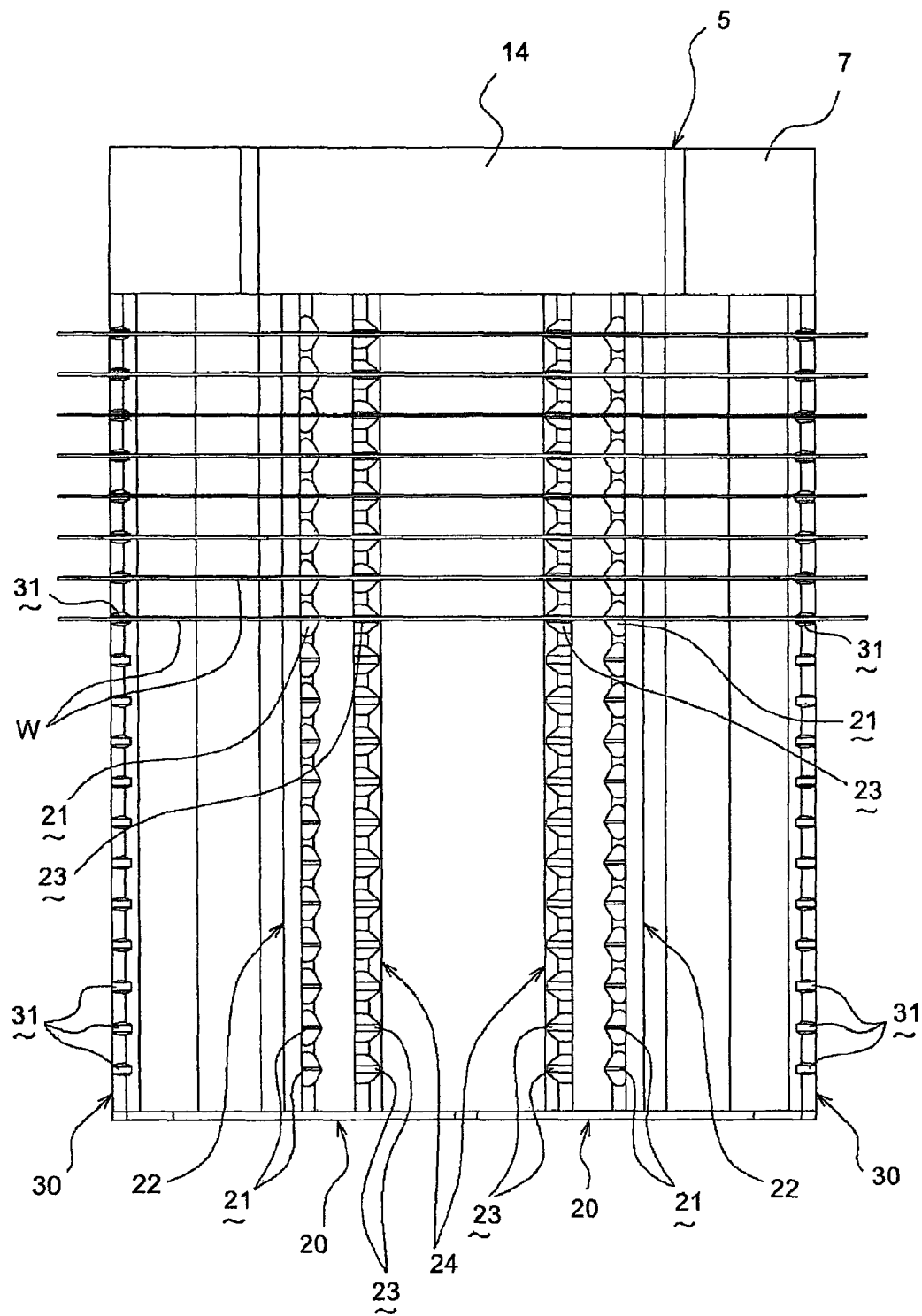
FIG. 4 is a plan view illustrating wafers held by a wafer boat according to the first embodiment.
Figure 5:
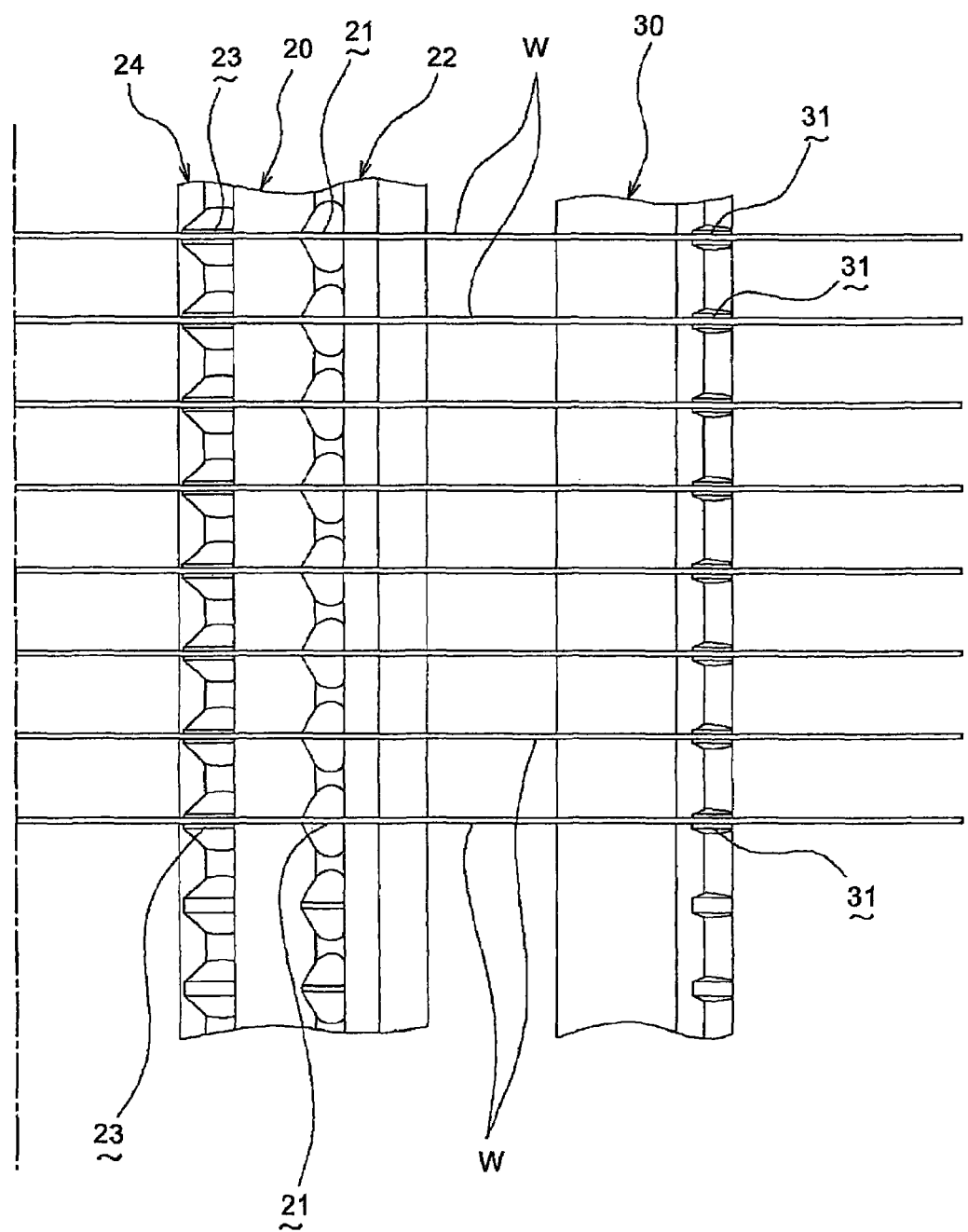
FIG. 5 is a main plan view illustrating wafers held by a wafer boat according to the first embodiment.
Figure 6:
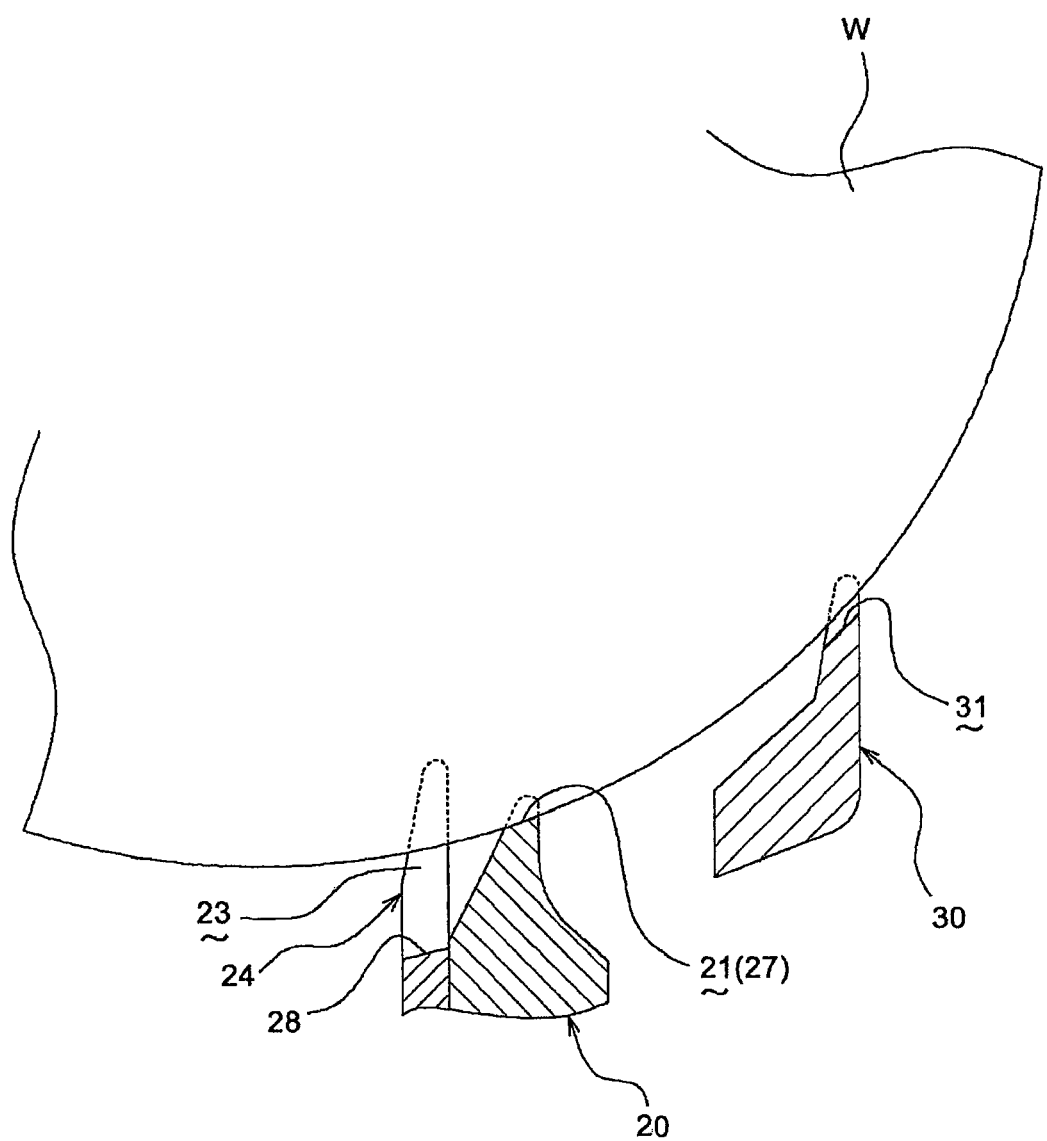
FIG. 6 is a front cross-sectional view of FIG. 5.
Figure 7:
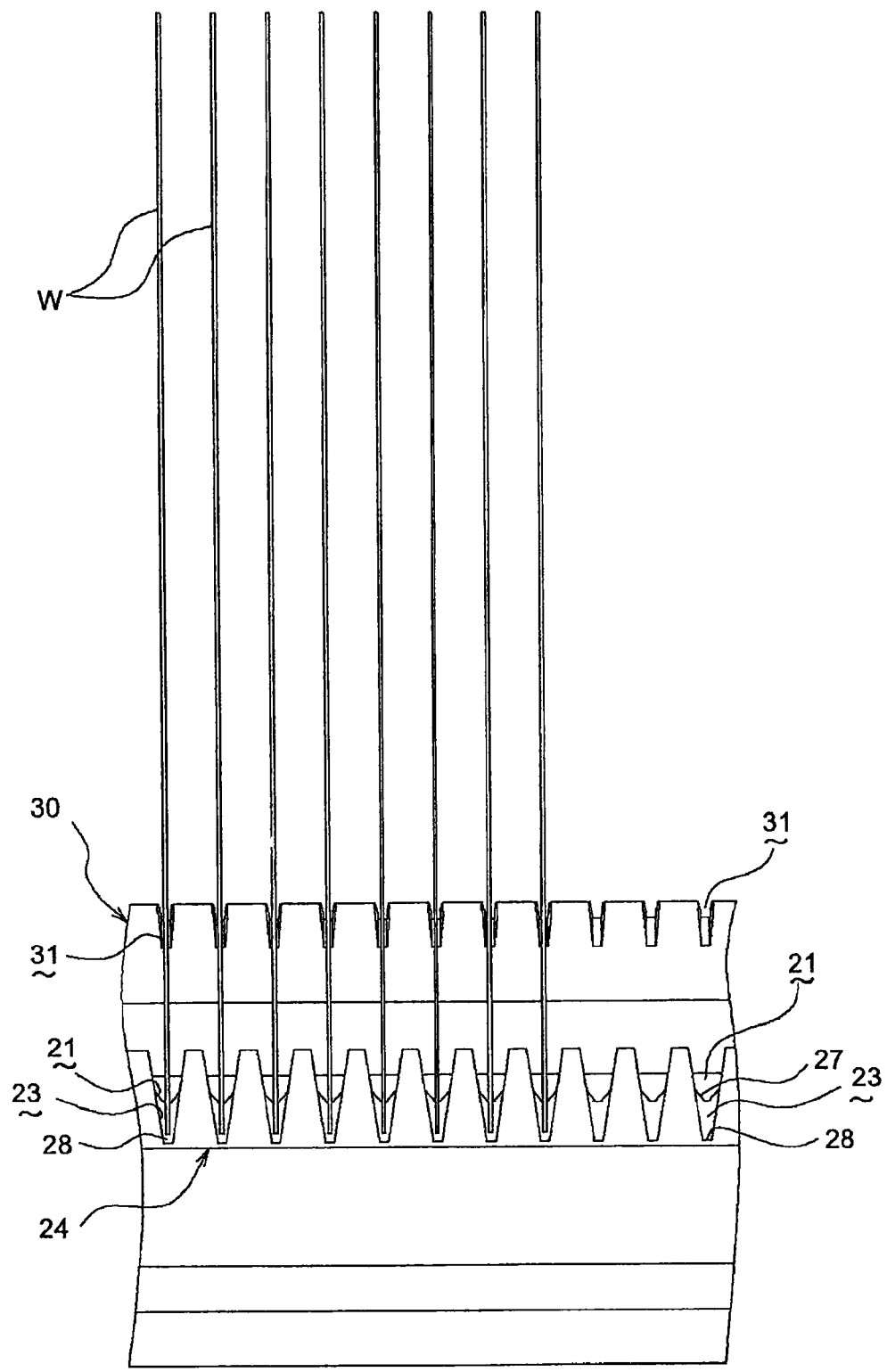
FIG. 7 is a left side view of FIG. 5.
Figure 8:
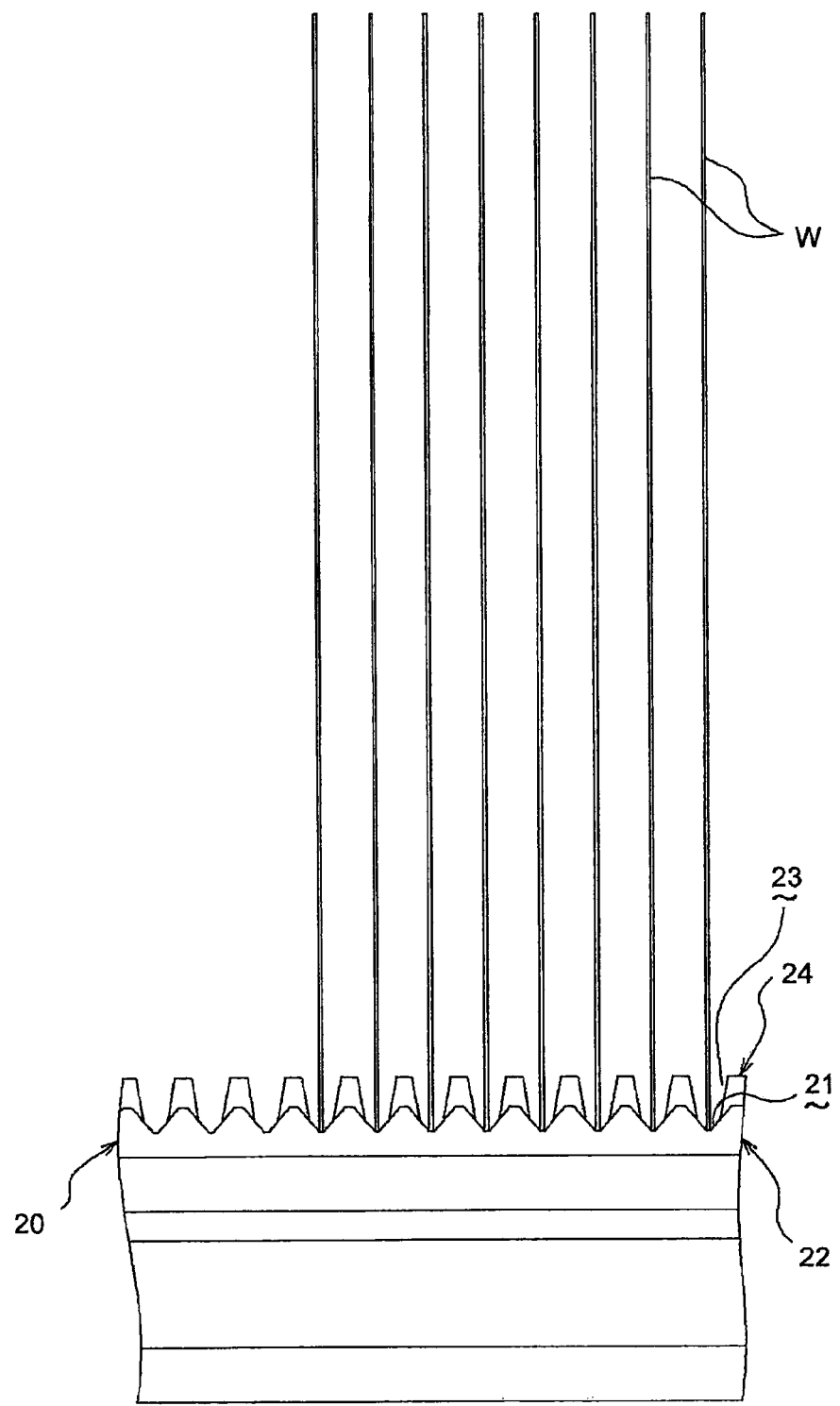
FIG. 8 is a right side view of FIG. 5.

As shown in FIGS. 1 and 2, wafer boat 5 mainly includes a guide part 7, and two (2) groups of holders horizontally fixed to guide part 7, which are parallel to each other, in which the holders include a couple of left/right lower holders 20 holding the bottom portion of the circumferential edge of wafer W, and a couple of left/right upper holders 30 for holding the bottom outer edges of the peripheral portion of wafer W when wafer W is turned over.

Lower holder 20 includes a holding groove part 22 and a turn-over prevention groove part 24, which are integrally formed with each other. Holding groove part 22 includes fifty (50) equally spaced holding grooves 21 directly holding the bottom portion of wafer W. Turn-over prevention groove part 24 is disposed adjacent to the inside of holding groove part 22 and includes fifty (50) equally spaced turn-over prevention grooves 23 for holding wafer W when the holding of wafer W by holding grooves 21 has been released, in other words, when wafer W has risen from holding grooves 21.

Herein, holding grooves 21 are formed as roughly V-shaped shallow grooves having a large opening angle. Turn-over prevention grooves 23 include an open end 26 which is higher than an open end 25 of holding grooves 21, and a groove bottom 28 which is deeper than a groove bottom 27 of holding grooves 21, and are formed as roughly V-shaped deep grooves having a smaller opening angle than that of holding grooves 21. Turn-over prevention grooves 23 may be formed as roughly Y-shaped deep grooves having a smaller opening angle than that of holding grooves 21.

Turn-over prevention grooves 23 may be formed in accordance with the width of the opening of holding grooves 21 by forming holding grooves 21 and turn-over prevention grooves 23 as described above. Accordingly, holding grooves 21 and turn-over prevention grooves 23 may be arranged with the same pitch. In addition, multiple holding grooves 21 and turn-over prevention grooves 23 may be formed in a small space.

Holding grooves 21 and holding groove part 22 are formed downward with a slant toward turn-over prevention grooves 23 and turn-over prevention groove part 24. Also, a top portion 29 between adjacent holding grooves 21 has a circular arc shape. Such formation of holding grooves 21 and holding groove part 22, downward with a slant toward turn-over prevention grooves 23 and turn-over prevention groove part 24, as described above, may allow the processing liquid remaining in holding grooves 21 and the processing liquid attached to holding groove part 22 to flow toward turn-over prevention grooves 23. Also, due to the circular arc shape of top portion 29 between adjacent holding grooves 21, it is possible to prevent fluid drops from being attached to top portion 29 between adjacent holding grooves 21.

Holding groove part 22 having holding grooves 21 as configured above is made of a hydrophilic member, for example, polyetheretherketone (PEEK). Meanwhile, turn-over prevention groove part 24 having turn-over prevention grooves 23 is made of a hydrophobic member, for example, polychlorotrifluoroethylene (PCTFE), polytetrafluoroethylene (PTFE), or perfluoroalkoxy resin (PFA). Herein, at least the surface of holding groove part 22 may be made of a hydrophilic member. Also, at least the surface of turn-over prevention groove part 24 may be made of a hydrophobic member.

As described above, since at least the surface of holding groove part 22 is made of a hydrophilic member, holding groove part 22 in contact with wafer W can inhibit processing liquid (chemical liquid or rinse liquid) from remaining on wafer W by adsorbing the processing liquid. Also, since at least the surface of turn-over prevention groove part 24 having turn-over prevention grooves 23 is made of a hydrophobic member, turn-over prevention groove part 24 not in contact with wafer W can inhibit the remaining of processing liquid which has been used for the processing, by resisting the processing liquid (chemical liquid or rinse liquid). Accordingly, the remaining of processing liquid that has been used for liquid treatment can be significantly reduced, thereby more effectively inhibiting the occurrence of spots, such as watermarks.

In an upper holder 30, fifty (50) roughly Y-shaped holding grooves 31 having a double-tapered-shaped cross section are formed equally spaced therebetween, in which an opening angle of the upper tapered portion at the opening side is larger than that of the lower tapered portion of the bottom groove portion. Holding grooves 31 are for preventing wafer W from turning over, and in a state where wafer W is directly held by holding grooves 21 of lower holder 20, holding grooves 31 are not in contact with wafer W.

In wafer boat 5, a shaft 14 extending from guide part 7 is slidably movably inserted into a through hole 16c at the top portion of vessel cover 16b, and an expandable O-ring 17b is intervened between through hole 16c and shaft 14 to maintain air tightness and water tightness of the inside of drying chamber 2. Lifting device (not shown) of wafer boat 5 is connected to CPU 10, and is operable by a control (operation) signal from CPU 10.

Processing tank 1 and drying chamber 2 are disposed in a row while putting a communication hole 15a between them. Herein, a shutter 9 (an opening/closing means) is disposed at communication hole 15a in such a manner that it can open and close. Processing tank 1 and drying chamber 2 can be blocked up by shutter 9. Herein, a driving unit 9a of shutter 9 is electrically connected to CPU 10, and can open or close communication hole 15a by a control (operation) signal from CPU 10.

Drying gas supply means 6 mainly includes gas supply nozzles 11A disposed at both sides of the center within drying chamber 2, a drying gas (e.g., N2 gas) supply source 6a connected to gas supply nozzles 11A via a gas supply tube 18, and a second opening/closing valve V2 provided in gas supply tube 18. Herein, a temperature controller 6b is provided in gas supply tube 18, and allows high temperature N2 gas to be generated. Temperature controller 6b and second opening/closing valve V2 are configured in such a manner that they can operate by a control (operation) signal from CPU 10.

Chemical-liquid supply means 3, rinse-liquid supply means 4, and drying gas supply means 6, wafer boat 5, vessel cover lifting device 8, and shutter 9 are controlled based on the information previously programmed in CPU 10.

Hereinafter, one example of a wafer W processing process using the washing/drying apparatus will be described. First, multiple (for example, 50) wafers W carried by a wafer carrying means (not shown) are transferred to wafer boat 5 which has been moved up to the upper side of the washing/drying apparatus, and then when wafer boat 5 is moved down, vessel cover 16b is blocked up, thereby housing wafer W within processing tank 1. In a state where wafer W is housed in processing tank 1, pump 3b is operated, first opening/closing valve V1 is opened, and opening/closing switch valve V0 is switched to a mode for chemical-liquid supply tank 3a, thereby supplying (immersing) chemical liquid (DHF) to wafer W housed in processing tank 1. Then, an etching process by DHF is carried out to remove an oxide film on the surface of wafer W. Next, after pump 3b is stopped, opening/closing switch valve V0 is switched to a mode for DIW supply source 4a, and thereby supplies rinse liquid (DIW) to wafer W housed in processing tank 1. Then, the rinse liquid overflows into outer tank 1b while washing the surface of wafer W. During the etching process or rinsing process, in the case where wafer W rises from holding grooves 21, turn-over of wafer W is prevented by turn-over prevention grooves 23.

After the etching process for removing the oxide film from the surface of wafer W and the rinsing process for washing the surface of wafer W, as described above, wafer boat 5 is moved up, thereby moving wafer W into drying chamber 2 above processing tank 1. Herein, shutter 9 is moved to a blocking position, thereby blocking up drying chamber 2 and processing tank 1, and tightly closing the inside of drying chamber 2. In this state, second opening/closing valve V2 is opened, and then high temperature N2 gas is supplied from N2 gas supply source 6a into drying chamber 2 through the operation of temperature controller 6b, thereby carrying out a drying process of wafer W. In this drying process, there is no concern about the occurrence of watermarks on the surface of wafer W, because the contact area between wafer W and holding grooves 21 is small, and only a small amount of liquid can be attached to wafer W.

After the above described drying process, vessel cover 16b is moved up by the operation of lifting device 8, thereby opening loading/unloading hole 15 of vessel body 16a. Then, wafer boat 5 is moved up, and thereby wafer W is upwardly unloaded from drying chamber 2. Then, wafer W is transferred to the wafer carrying means (not shown) and is carried to a processing unit in the next step.

Second Embodiment

Figure 9:
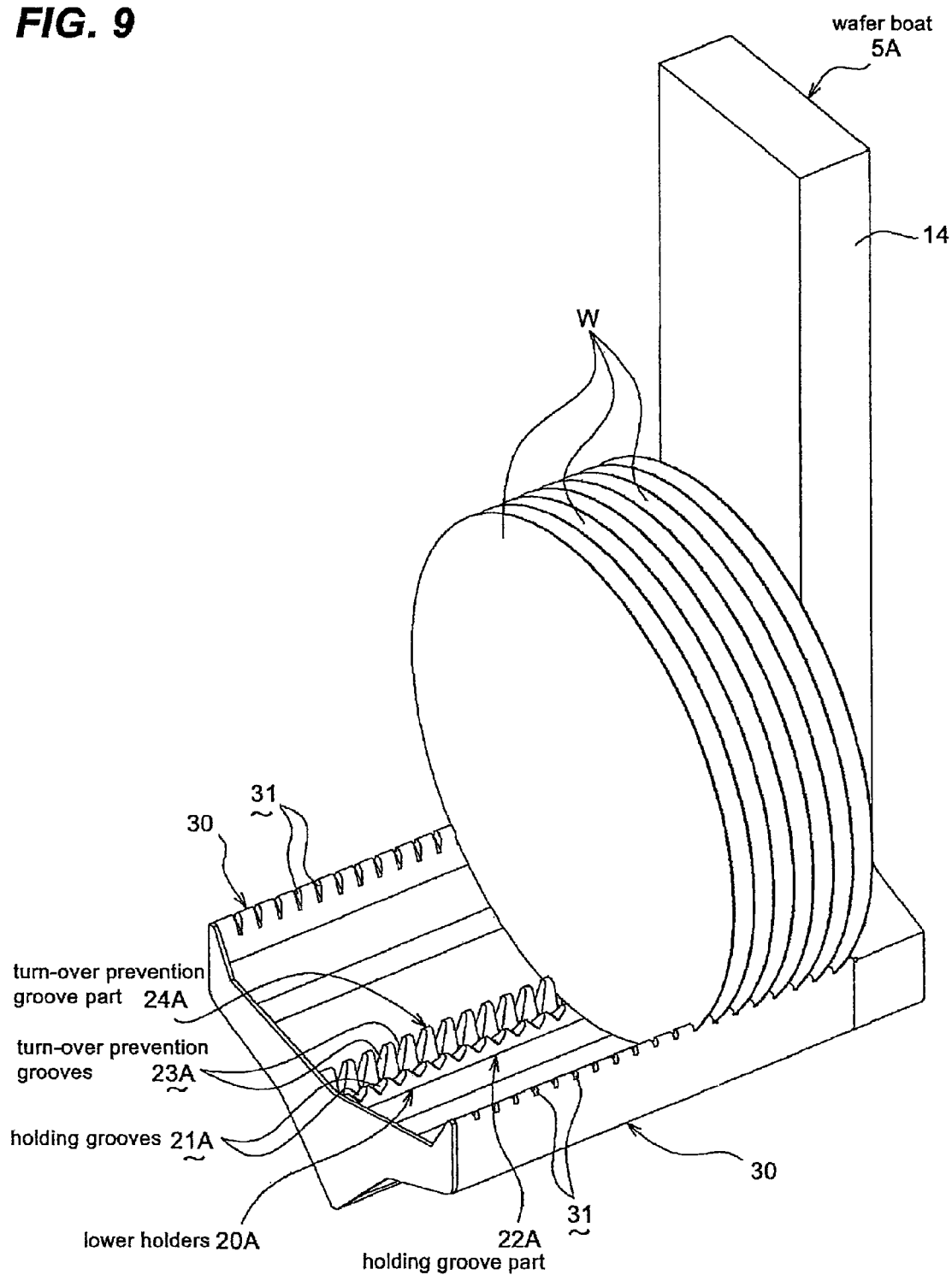
FIG. 9 is a perspective view illustrating a wafer boat according to a second embodiment.
Figure 10:
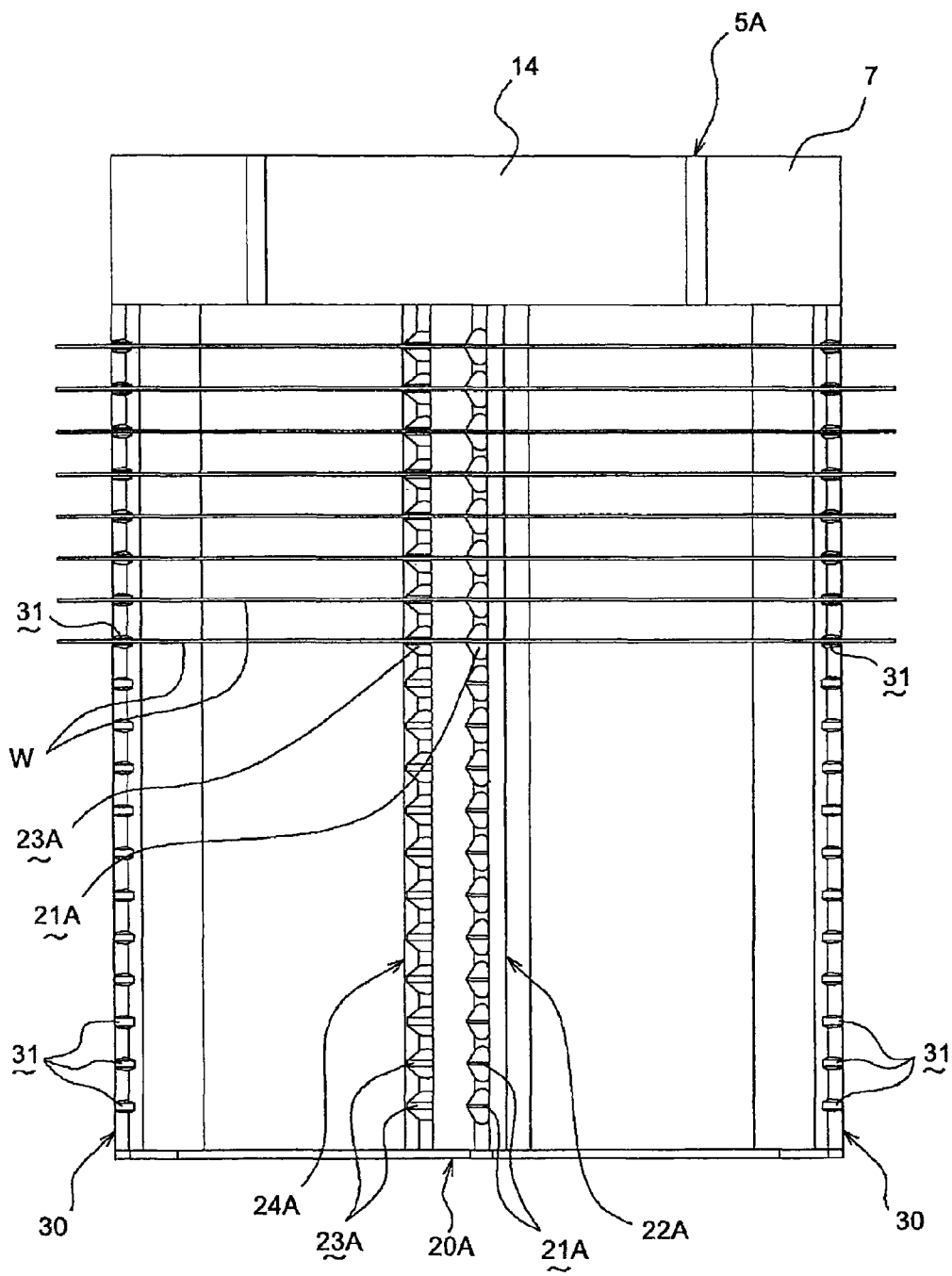
FIG. 10 is a plan view illustrating holding grooves and turn-over prevention grooves of a lower holder according to the second embodiment.
Figure 11:
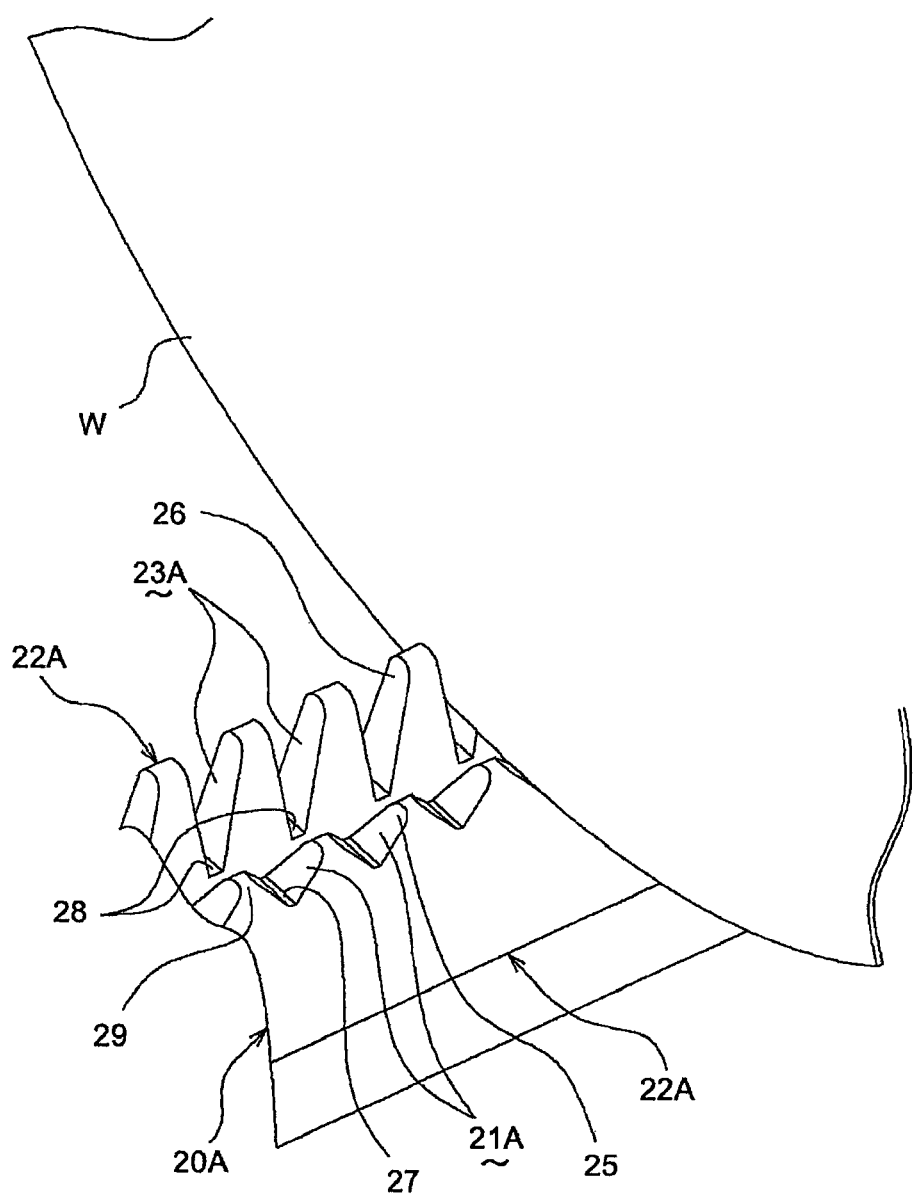
FIG. 11 is an enlarged perspective view of a main part including holding grooves and turn-over prevention grooves of a lower holder according to the second embodiment.
Figure 12:
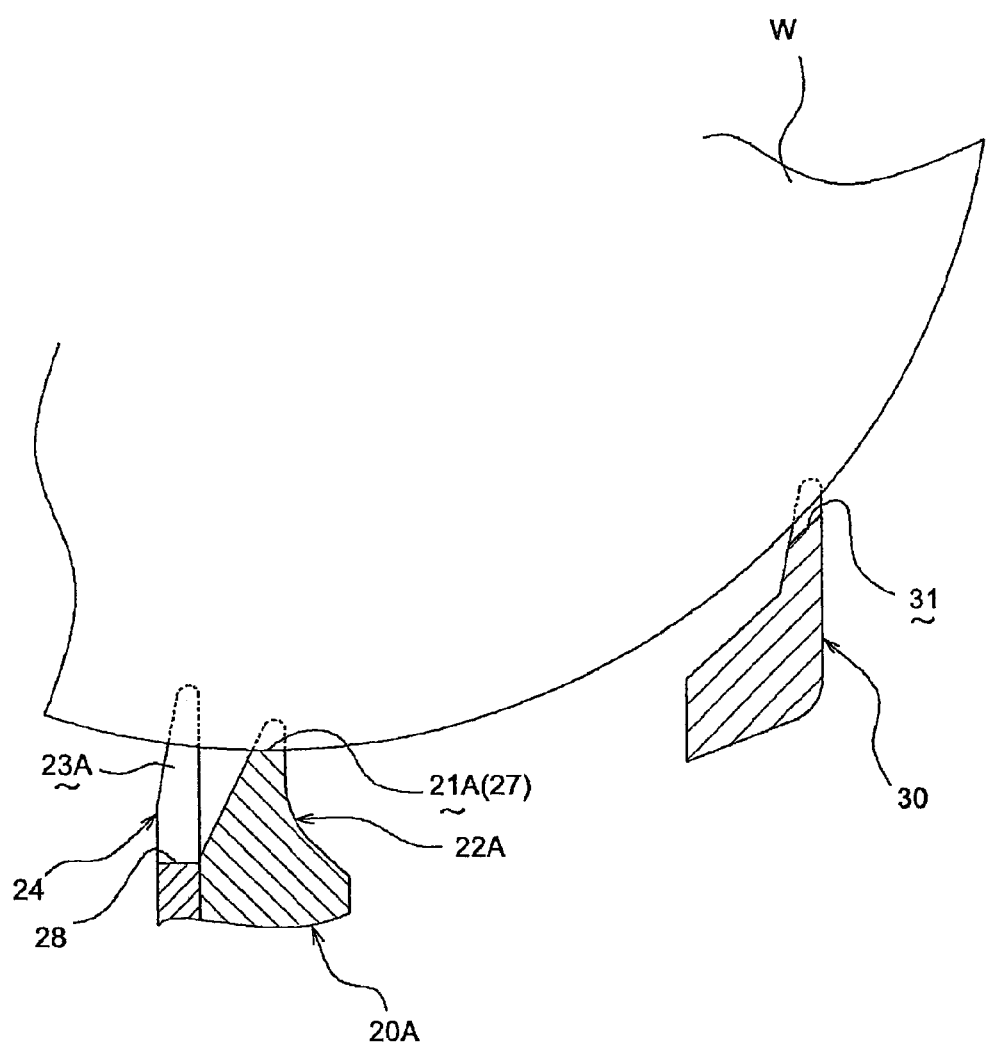
FIG. 12 is a main front cross-sectional view illustrating a wafer held by a wafer boat according to the second embodiment.
Figure 13:
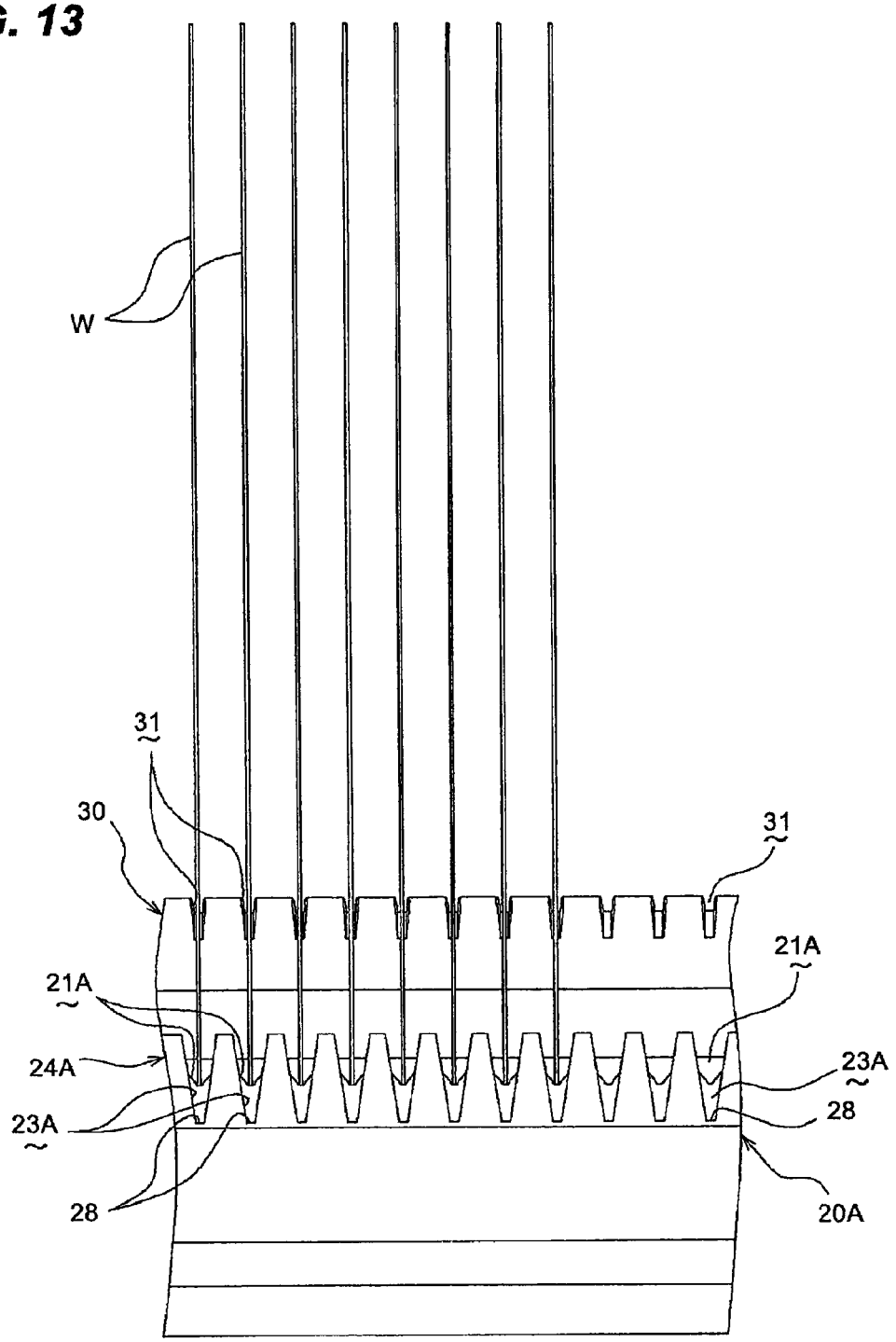
FIG. 13 is a left side view of FIG. 12.
Figure 14:
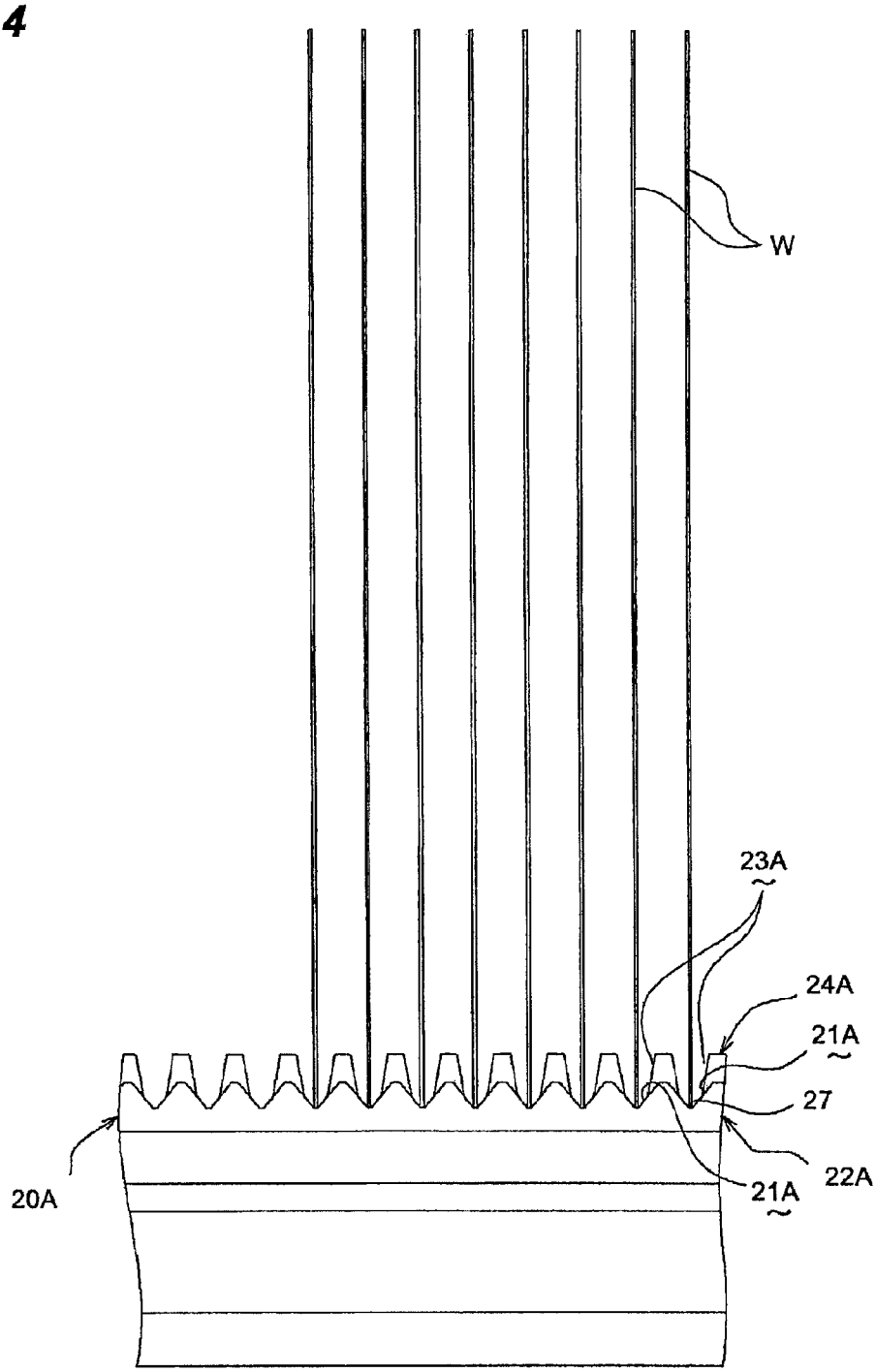
FIG. 14 is a right side view of FIG. 12.

Although two lower holders 20 are described in the first embodiment, only one lower holder 20A may be used. In other words, a wafer boat 5A according to a second embodiment, as shown in FIGS. 9 and 10, mainly includes a guide part 7, and holders horizontally fixed to guide part 7, which are parallel to each other. The holders include one lower holder 20A holding the bottom portion of the circumferential edge of wafer W, and a couple of left/right upper holders 30 for holding the bottom outer edges of the peripheral portion of wafer W when wafer W is turned over.

Herein, lower holder 20A includes a holding groove part 22A and a turn-over prevention groove part 24A, which are integrally formed with each other. Holding groove part 22A includes fifty (50) equally spaced holding grooves 21A directly holding the lowermost end portion of wafer W. Turn-over prevention groove part 24A is disposed adjacent to the outside of holding groove part 22A, and includes fifty (50) equally spaced turn-over prevention grooves 23A for holding wafer W when the holding of wafer W by holding grooves 21A has been released, in other words, when wafer W has risen from holding grooves 21A. Also, in drawings, although turn-over prevention groove part 24A is disposed at the left side of holding groove part 22A from the front view, turn-over prevention groove part 24A may be disposed at the right side of holding groove part 22A.

Herein, like holding grooves 21 in the first embodiment, holding grooves 21A are formed as roughly V-shaped shallow grooves having a large opening angle. Also, turn-over prevention grooves 23A include an open end 26 which is higher than an open end 25 of holding grooves 21A, and a groove bottom 28 which is deeper than a groove bottom 27 of holding grooves 21A, and are formed as roughly V-shaped (or Y-shaped) deep grooves having a smaller opening angle than that of holding grooves 21A, in the same manner as turn-over prevention grooves 23 in the first embodiment, except that it is provided in turn-over prevention groove part 24A disposed adjacent to the outside of holding groove part 22A.

Turn-over prevention grooves 23A may be formed in accordance with the width of the opening of holding grooves 21A by forming holding grooves 21A and turn-over prevention grooves 23A, as described above. Accordingly, holding grooves 21A and turn-over prevention grooves 23A may be arranged with the same pitch, and multiple holding grooves 21A and turn-over prevention grooves 23A may be in a small space.

Holding grooves 21A and holding groove part 22A are formed downward with a slant toward turn-over prevention grooves 23A and turn-over prevention groove part 24A, and a top portion 29 between adjacent holding grooves 21A has a circular arc shape. Such formation of holding grooves 21A and holding groove part 22A, downward with a slant toward turn-over prevention grooves 23A and turn-over prevention groove part 24A, as described above, may allow processing liquid remaining in holding grooves 21A and processing liquid attached to holding groove part 22A to flow toward turn-over prevention grooves 23A. Also, due to the circular arc shape of top portion 29A between adjacent holding grooves 21A, it is possible to inhibit fluid drops from being attached to top portion 29A between adjacent holding grooves 21A.

In the same manner as the first embodiment, at least the surface of holding groove part 22A having holding grooves 21A is made of a hydrophilic member, for example, polyetheretherketone (PEEK), and at least the surface of turn-over prevention groove part 24A having turn-over prevention grooves 23A is made of a hydrophobic member, for example, polychlorotrifluoroethylene (PCTFE), polytetrafluoroethylene (PTFE), or perfluoroalkoxy resin (PFA).

In the second embodiment, other elements except wafer boat 5A are the same as those in the first embodiment, and thus the description thereof will be omitted.

According to the second embodiment, since the contact area with wafer W can be smaller than in the first embodiment, the remaining of processing liquid that has been used for liquid treatment can be significantly reduced, thereby inhibiting the occurrence of spots, such as watermarks.

Another Embodiment

Although the apparatus according to the above embodiments includes, lower holders 20 or 20A holding the bottom portion of wafer W, and a couple of left/right upper holders 30 for holding the bottom outer edges of wafer W when wafer W is turned over, the reverse configuration is feasible. In other words, another configuration may include a couple of left/right upper holders for holding the bottom outer edges of wafer W, and lower holders for holding the bottom portion of wafer W when wafer W is turned over.

Also, although in the above embodiments, the substrate processing apparatus according to the present disclosure is applied to the washing/drying apparatus for wafer W, the substrate processing apparatus according to the present disclosure may be applied to any substrate processing apparatus as long as it includes a carrying means for vertically holding wafer W.

Also, the substrate processing apparatus according to the present disclosure may be applied to any to-be-processed substrate (e.g., an FPD substrate, etc.), other than a wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus that includes a carrying means to carry a plurality of substrates while vertically holding the plurality of substrates with a plurality of holders, at least one of the plurality of holders comprising:
    a holding groove part including a roughly V-shaped holding groove directly holding the bottom portion of the substrate; and
    a turn-over prevention groove part disposed adjacent to the holding groove part, the turn-over prevention groove part including a roughly V-shaped turn-over prevention groove having an open end that is higher than the open end of the adjacent holding groove, a groove bottom deeper than the groove bottom of the adjacent holding groove, and an opening angle that is smaller than the opening angle of the holding groove,
    wherein the turn-over prevention groove is not in contact with the substrate when the substrate is held by the holding groove, and
    wherein the holding groove part is formed downwardly with a slant toward the turn-over prevention groove part.

2. The substrate processing apparatus as claimed in claim 1, further comprising a processing tank to contain processing liquid,
    wherein the substrate is immersed in the processing liquid within the processing tank while the substrate is held by the holders of the carrying means.

3. The substrate processing apparatus as claimed in claim 1, wherein the carrying means comprises a lower holder to hold the bottom portion of the substrate, and a couple of left/right upper holders to hold the bottom outer edges of the substrate when the substrate is turned over.

4. The substrate processing apparatus as claimed in claim 1, wherein the carrying means comprises a couple of left/right upper holders for holding the bottom outer edges of the substrate, and a lower holder for holding the bottom portion of the substrate when the substrate is turned over.

5. The substrate processing apparatus as claimed in claim 3, wherein the lower holder comprises multiple holding grooves and multiple turn-over prevention grooves, the multiple holding grooves and multiple turn-over prevention grooves being provided in parallel to each other to hold multiple substrates in parallel to each other.

6. The substrate processing apparatus as claimed in claim 4, wherein the upper holders comprise multiple holding grooves and multiple turn-over prevention grooves, the multiple holding grooves and multiple turn-over prevention grooves being provided in parallel to each other to hold multiple substrates in parallel to each other.

7. The substrate processing apparatus as claimed in claim 1, wherein at least a surface of the holding groove part having the holding groove is made of a hydrophilic member.

* * * * *